United States Patent
Lee et al.

(10) Patent No.: US 8,709,839 B2
(45) Date of Patent: Apr. 29, 2014

(54) METHOD OF FABRICATING SEMICONDUCTOR LIGHT EMITTING DEVICE

(75) Inventors: Jong Hyun Lee, Seoul (KR); Dong Ju Lee, Gyeonggi-do (KR); Young Sun Kim, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 68 days.

(21) Appl. No.: 13/493,342

(22) Filed: Jun. 11, 2012

(65) Prior Publication Data

US 2012/0322191 A1  Dec. 20, 2012

(30) Foreign Application Priority Data

Jun. 14, 2011  (KR) .................. 10-2011-0057254

(51) Int. Cl.
*H01L 21/00*  (2006.01)
(52) U.S. Cl.
USPC .................. 438/23; 438/22; 257/E33.008
(58) Field of Classification Search
USPC ..................................... 438/22–47
See application file for complete search history.

(56) References Cited

U.S. PATENT DOCUMENTS

| | | | | |
|---|---|---|---|---|
| 7,045,404 B2 * | 5/2006 | Sheppard et al. | | 438/191 |
| 7,122,827 B2 * | 10/2006 | Alizadeh et al. | | 257/17 |
| 7,901,994 B2 * | 3/2011 | Saxler et al. | | 438/123 |
| 7,932,106 B2 * | 4/2011 | Li | | 438/22 |
| 8,118,934 B2 * | 2/2012 | Wang | | 117/94 |
| 8,188,573 B2 * | 5/2012 | Guo et al. | | 257/615 |
| 8,502,193 B2 * | 8/2013 | Song | | 257/13 |
| 2004/0251519 A1 * | 12/2004 | Sugahara et al. | | 257/615 |
| 2006/0189020 A1 * | 8/2006 | Kim | | 438/47 |
| 2007/0099321 A1 * | 5/2007 | Miyachi et al. | | 438/28 |
| 2009/0090930 A1 * | 4/2009 | Chen et al. | | 257/103 |
| 2011/0018002 A1 * | 1/2011 | Chen et al. | | 257/76 |
| 2011/0073995 A1 * | 3/2011 | Nomura et al. | | 257/615 |
| 2011/0124139 A1 * | 5/2011 | Chang | | 438/40 |
| 2011/0168971 A1 * | 7/2011 | Song | | 257/13 |
| 2011/0210309 A1 * | 9/2011 | Ben-Ishai et al. | | 257/9 |
| 2011/0294281 A1 * | 12/2011 | Zang et al. | | 438/478 |
| 2012/0119220 A1 * | 5/2012 | Guo et al. | | 257/76 |
| 2012/0119359 A1 * | 5/2012 | Im et al. | | 257/737 |
| 2012/0322191 A1 * | 12/2012 | Lee et al. | | 438/47 |

FOREIGN PATENT DOCUMENTS

| | | |
|---|---|---|
| JP | 2008-544567 A | 12/2008 |
| KR | 10-2005-0113643 A | 12/2005 |
| KR | 10-2006-0038059 A | 5/2006 |
| KR | 10-2006-0105069 A | 10/2006 |
| KR | 10-2009-0089575 A | 8/2009 |
| KR | 10-2010-0023085 A | 3/2010 |

* cited by examiner

*Primary Examiner* — Seahvosh Nikmanesh
*Assistant Examiner* — Evren Seven
(74) *Attorney, Agent, or Firm* — McDermott Will & Emery LLP (57) ABSTRACT

There is provided a method of fabricating a semiconductor light emitting device, including: forming a sacrificial layer having a plurality of nanostructures on a growth substrate; forming a protective layer to cover the sacrificial layer; forming a light emitting structure by allowing a first conductive semiconductor layer, an active layer and a second conductive semiconductor layer to be sequentially grown on the protective layer; etching the protective layer to expose the nanostructures; and separating the light emitting structure from the growth substrate by etching the exposed nanostructures, whereby damage and degradation of a light emitting structure at the time of the separation thereof may be prevented.

20 Claims, 5 Drawing Sheets

METHOD OF FABRICATING SEMICONDUCTOR LIGHT EMITTING DEVICE

CROSS-REFERENCE TO RELATED APPLICATIONS

This application claims the priority of Korean Patent Application No. 10-2011-0057254 filed on Jun. 14, 2011, in the Korean Intellectual Property Office, the disclosure of which is incorporated herein by reference.

BACKGROUND OF THE INVENTION

1. Field of the Invention

The present invention relates to a method of fabricating a semiconductor light emitting device.

2. Description of the Related Art

A semiconductor light emitting diode (LED) converts electrical energy into light energy through the recombination of electrons and holes, to emit light due to materials included therein. LEDs are widely used as in general illumination devices, display devices, and general light sources at present, and the further development thereof is being accelerated.

In particular, with the commercialization of a cellular phone keypad, a side mirror turn signal, a camera flash and the like, using a gallium nitride (GaN)-based light emitting diode of which the development and entry into wide-spread use have been completed, the development of general illumination devices using light emitting diodes has been actively undertaken in recent years. Applications thereof including backlight units for large-sized TVs, vehicle headlights, and general illumination devices have progressed to large-sized, high-output, and high-efficiency products from small-sized portable products, such that light sources having characteristics required byproducts in which they are intended for use are required.

In order to improve low light extraction efficiency of a light emitting diode, a light emitting diode having a structure in which a substrate has been removed has been used. However, since a growth substrate is separated from a semiconductor layer by a laser lift-off (LLO) process, the semiconductor layer may be degraded or damaged and broken due to the generation of relatively high temperatures from a laser beam, whereby a production yield may be reduced.

SUMMARY OF INVENTION

An aspect of the present invention provides a method of fabricating a semiconductor light emitting device, through which a damage to and degradation of a light emitting structure at the time of separation of a growth substrate and a light emitting structure may be reduced.

According to an aspect of the present invention, there is provided a method of fabricating a semiconductor light emitting device, the method including: forming a sacrificial layer having a plurality of nanostructures on a growth substrate; forming a protective layer to cover the sacrificial layer; forming a light emitting structure by allowing a first conductive semiconductor layer, an active layer and a second conductive semiconductor layer to be sequentially grown on the protective layer; etching the protective layer to expose the nanostructures; and separating the light emitting structure from the growth substrate by etching the exposed nanostructures.

The growth substrate may have an upper surface divided into a first region on an edge of the growth substrate and a second region defined as a region of the upper surface excepting the first region, and the forming of the sacrificial layer may only be performed to form a plurality of nanostructures on the second region of the growth substrate. The first region may be positioned along the edge of the growth substrate so as to surround the second region.

Here, the growth substrate may be formed of a sapphire substrate, a silicon substrate, a silicon carbide substrate or a spinel substrate.

The first region may be spaced apart from the edge of the growth substrate by 1 mm or less.

The protective layer may be formed to be extended to the second region of the growth substrate.

The nanostructures may be formed of a zinc oxide (ZnO)-based compound, the nanostructures may be formed by allowing a plurality of nanorods to be grown on the growth substrate, and the plurality of nanorods may be provided such that a height thereof and an interval therebetween have a ratio of 50:1 to 100:1.

The protective layer may be formed of a metal nitride-based compound.

The protective layer may be formed of an aluminum nitride (AlN) or Chromium nitride (CrN), or by alternately laminating the aluminum nitride and the CrN, and the protective layer may be formed by a sputtering method.

The etching of the protective layer to expose the nanostructures may be performed to etch the protective layer positioned on the first region so as to expose a side surface of the nanostructures, and the separating of the growth substrate from the light emitting structure may be performed by chemical wet etching. Here, a solution used in the chemical wet etching may be HCl or hafnium (HF).

The method may further include forming a buffer layer on the protective layer before the forming of the light emitting structure thereon, and the buffer layer may include a gallium nitride (GaN) or silicon carbide (SiC).

In addition, the method may further include providing a support substrate on the light emitting structure before the separating of the growth substrate therefrom.

Also, the method may further include forming an electrode on a lower surface of the first conductive semiconductor layer from which the growth substrate has been separated after the separating of the growth substrate from the light emitting structure.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Embodiments of the present invention will now be described in detail with reference to the accompanying drawings, such that those having ordinary skill in the art to which the invention pertains could easily implement the embodiments described herein. However, it should be noted that the spirit of the present invention is not limited to the embodiments set forth herein and that those skilled in the art and understanding the present invention could easily accomplish retrogressive inventions or other embodiments included in the spirit of the present invention by the addition, modification, and removal of components within the same spirit, but those are to be construed as being included in the spirit of the present invention.

FIGS. 1 to 9 are cross-sectional views of a process providing an example of a method of manufacturing a semiconductor light emitting device according to an embodiment of the present invention.

A method of manufacturing a semiconductor light emitting device 100 according to an embodiment of the present invention may include forming a sacrificial layer 120 on a growth substrate 110, forming a protective layer 130, forming a light emitting structure 140, etching the protective layer 130, and separating the light emitting structure 140 from the growth substrate 110.

Figure 1:
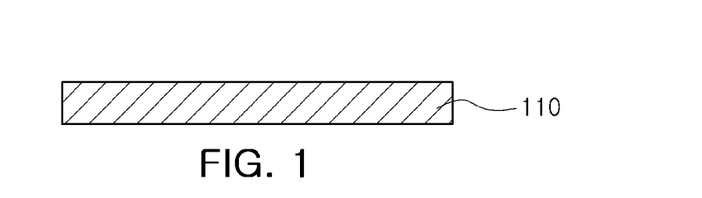
FIGS. 1 to 9 are cross-sectional views a process providing an example of a method of manufacturing a semiconductor light emitting device according to an embodiment of the present invention.

First, as shown in FIG. 1, the growth substrate 110 may be prepared within a chamber of an organic metal chemical vapor deposition (MOCVD) apparatus. As the growth substrate 110, a sapphire ($Al_2O_3$) substrate, a silicon (Si) substrate, a silicon carbide (SiC) substrate or a spinel substrate may be used, but the present invention is not limited thereto, and any substrate may be used as long as it is a substrate that is not damaged in a process performed even at a temperature of 1000° C. or higher.

Figure 2:
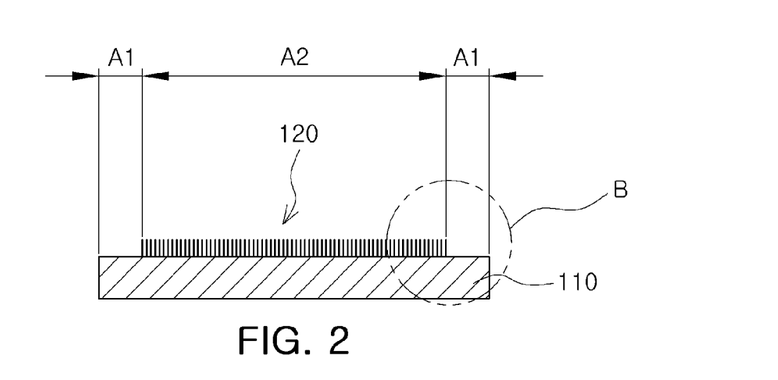

As shown in FIG. 2, an upper surface of the growth substrate 110 may be divided into a first region A1 on an edge of the growth substrate 110 and a second region A2 defined as a region of the upper surface excepting the first region A1. The first region A1 may be provided as a portion on which the sacrificial layer 120 to be described below is not formed, and the second region A2 may be provided as a portion on which the sacrificial layer is formed.

Figure 11:
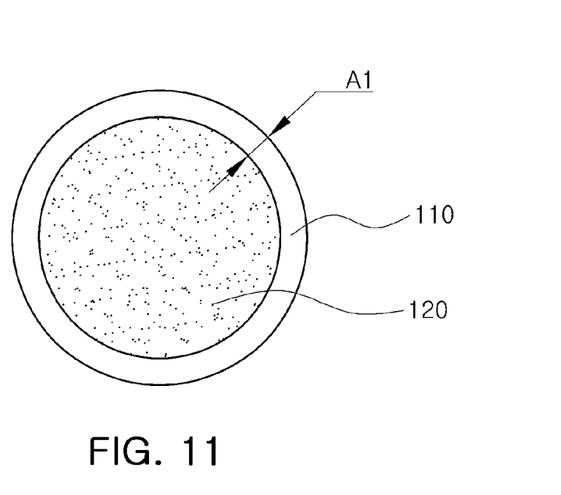
FIG. 11 is a plan view as viewed above a growth substrate shown in FIG. 2.

As shown in FIG. 11, the first region A1 may be positioned along an edge of the growth substrate 110 so as to surround the second region A2.

The first region A1 may have a predetermined width and maybe formed to surround the second region A2. Here, the first region A1 maybe spaced apart from an edge of the growth substrate 110 by 1 mm or less.

Next, as shown in FIG. 2, the sacrificial layer 120 may be formed on the growth substrate 110.

The sacrificial layer 120 may be a layer selectively etched by using a relatively high etching rate. Since the sacrificial layer 120 has a high etching speed as compared with that of another layer to be described below, when the sacrificial layer 120 is removed by an etching solution, an etching atmosphere, or the like, the growth substrate 110 may be separated from the light emitting structure 140.

The sacrificial layer 120 may have a plurality of nanostructures, and the nanostructures may be formed of a zinc oxide (ZnO), wherein at least a portion of zinc (Zn) in the ZnO may be substituted with cadmium (Cd) or magnesium (Mg) and may be used as an oxide represented by $Zn_{1-x-y}Mg_xCd_yO$. Here, x and y values may satisfy $0≤x≤1$, $0≤y≤1$, and $0≤x+y≤1$.

As such, when Cd or Mg is alloyed with ZnO, since a lattice constant difference from a crystal layer, for example, the protective layer 130, to be subsequently grown on the sacrificial layer 120, may be reduced, the subsequently grown crystal layer may be relatively more stable.

The nanostructure maybe formed to have various shapes, that is, a columnar shape, a needle-like shape, a tubular shape, and a disk shape, among polygons having a circular, rectangular or hexagonal horizontal cross-sectional shape.

Figure 10:
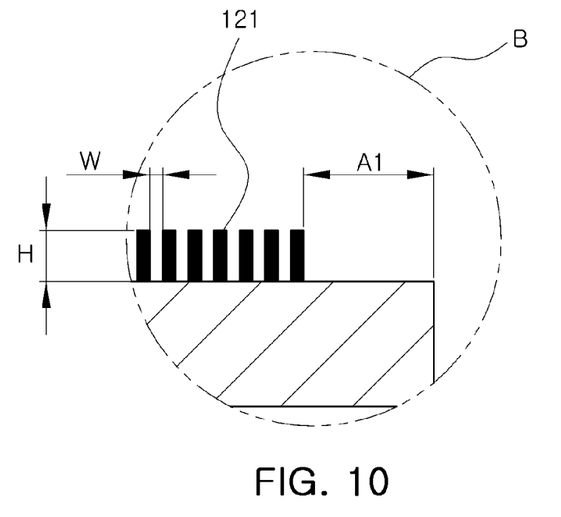
FIG. 10 is an enlarged cross-sectional view of part B of a growth substrate shown in FIG. 2.

As shown in FIG. 10, in a case in which a nanostructure of the sacrificial layer 120 is formed of a cylindrical nanorod 121, a height H of the nanorod 121 and an interval between the nanorods 121 may be controlled such that a screen effect is represented on an upper surface of the plurality of nanorods 121. When the screen effect is represented on the upper surface of the nanorods 121, a thin film may not be formed in a space between the nanorods 121 and an effect in which a thin film is only formed on the upper surface of the nanorods without a space therebetween may be provided. In addition, since a space is formed between the nanorods 121, an etching solution may easily infiltrate between the nanorods 121 in an etching process to be described below.

Figure 12:
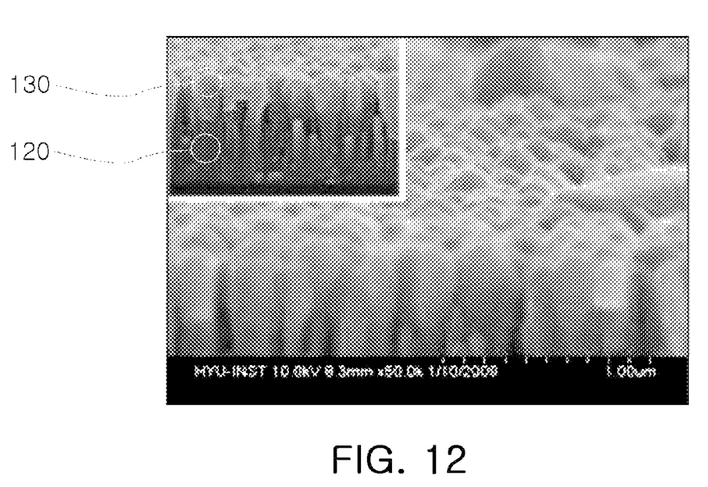
FIG. 12 shows an SEM image obtained by capturing a sacrificial layer and a protective layer

In detail, when the nanorods are provided such that the height H of the nanorods 121 and an interval between the nanorods have a ratio of 50:1 to 100:1 therebetween, and thus a screen effect is represented on an upper surface of the nanorods 121, the protective layer 130 may be formed on the upper surface of the plurality of nanorods 121. FIG. 12 shows an SEM image obtained by capturing the sacrificial layer 120 having the nanorods 121 and the protective layer.

The nanorods 121 as described above may be grown by forming a seed layer on the growth substrate 110 and introducing an oxygen ($O_2$) precursor and a diethylzinc (DEZn) precursor into a chamber. Here, a temperature and pressure within the chamber are uniformly maintained, and thus, the nanorods 121 may be grown to have a required height H by variably controlling a mole ratio between oxygen of the oxygen precursor and zinc of a zinc precursor. The plurality of nanorods 121 grown by the method described above may be uniformly formed on the growth substrate 110 in a manner in which they are excellently perpendicularly aligned, and may also be provided as defectless single crystals in which there are no potential or lamination defects.

With respect to the sacrificial layer 120, the plurality of nanostructures may only be formed on the second region A2 of the growth substrate 110. As such, in a case in which the nanostructures are not formed on the second region A2, the protective layer 130 to be described below and the growth substrate 110 may be in contact with each other on the second region A2.

Although the nanostructures may be grown by using a chemical vapor deposition (CVD) method, a molecular beam epitaxy (MBE) method, a hydride vapor phase epitaxy (HVPE) method, or the like, a simplified production process and relatively low production costs may be obtained by using the CVD method at the time of growing of the nanostructures 121.

In addition, the length H of the nanostructures 121 may be adjusted by controlling a reaction time at a growth temperature thereof, and an interval between the plurality of nanostructures 121 maybe adjusted by controlling the seed layer from which the nanostructures are be grown.

Figure 3:
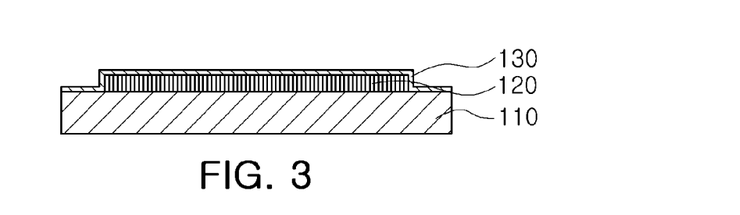

Next, as shown in FIG. 3, the protective layer 130 may be formed on the sacrificial layer 120 to cover the sacrificial layer 120. The protective layer 130 may seal the sacrificial layer 120 having the nanostructures, to thus prevent the sacrificial layer 120 from being damaged from chemical materials such as PR or stripper, an etching solution, etching gas, plasma, or the like, used in a photo process performed at the time of the formation of the light emitting structure 140 to be described below.

In detail, the protective layer 130 may be formed to prevent the sacrificial layer 120 from being etched due to $H_2$ and $NH_3$ mainly used in an MOCVD process for allowing the growth of a semiconductor layer.

As described above, since the sacrificial layer 120 having a nanostructure of ZnO may be relatively unstable, such that it may easily be volatilized, in order to form a semiconductor layer on the sacrificial layer 120 as described above, the MOCVD process of an $N_2$ atmosphere should be performed, but since the quality of a semiconductor layer manufactured in the MOCVD process of an $N_2$ atmosphere may be deteriorated, it may be difficult to implement actual mass production.

Therefore, in order to undertake the MOCVD process of an $H_2$ atmosphere able to implement a high quality nitride semiconductor layer, the protective layer 130 capable of preventing the sacrificial layer 120 from being volatilized due to $H_2$ may be required to be formed.

The protective layer 130 may be deposited by a physical method such as sputtering deposition or evaporation deposition. In this case, the sacrificial layer 120 may be prevented from being damaged due to a chemical method.

As such, since the protective layer 130 prevents damage to the sacrificial layer 120 generated during the MOCVD process at the time of formation of the light emitting structure 140, the sacrificial layer 120 may be maintained without damage up to a chemical etching stage.

The protective layer 130 may prevent the sacrificial layer 120 from being damaged at a point in time in which it is not required in subsequent processes. In addition, the protective layer 130 maybe formed on the sacrificial layer 120 so as to provide the light emitting structure 140 to be formed thereon, as a growth surface thereof.

In particular, the protective layer 130 maybe provided as a growth surface for reducing lattice mismatching of the light emitting structure 140 and the sacrificial layer 120 at the time of epitaxial growth.

For example, as for the protective layer 130, a metal nitride based compound may be used. In detail, the protective layer 130 maybe formed of an aluminum nitride (AlN) or Chromium nitride (CrN). Here, the protective layer 130 may have a multilayer structure in which AlN and CrN are alternately laminated.

As described above, when the sacrificial layer 120 is only formed on the second region A2 of the growth substrate 110, since the protective layer 130 formed on the first region A1 maybe formed to contact a circumference of the growth substrate 110, a side surface of the sacrificial layer 120 may be covered with the protective layer 130 as shown in FIG. 3. Thus, the sacrificial layer 120, liable to be volatilized, may be effectively blocked from contacting etching solution or an etching atmosphere.

Figure 4:
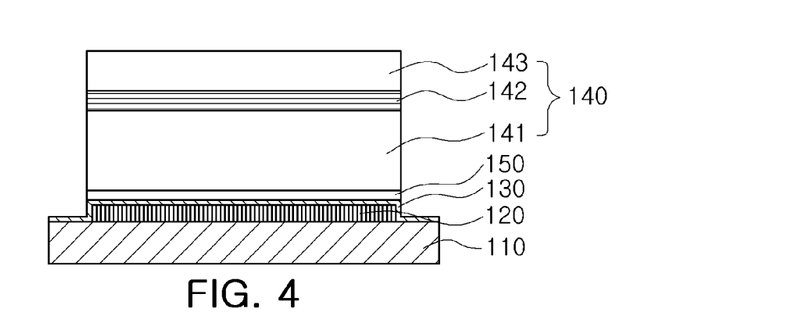

As shown in FIG. 4, then, the light emitting structure 140 having a multilayer structure of a semiconductor layer may be formed on the protective layer 130. The light emitting structure 140 may include a first conductive semiconductor layer 141, an active layer 142 and a second conductive semiconductor layer 143. The first conductive semiconductor layer 141 may have an n-type semiconductor layer, and the second conductive semiconductor layer 143 may have a p-type semiconductor layer.

The n-type semiconductor layer and the p-type semiconductor layer may be formed of a semiconductor material doped with an n-type impurity and a p-type impurity, expressed by an empirical formula: $Al_xIn_yGa_{1-x-y}N$, and representatively, GaN, AlGaN and InGaN may be used. Here, x and y values may satisfy $0 \leq x \leq 1$, $0 \leq y \leq 1$ and $0 \leq x+y \leq 1$, respectively.

Further, as the n-type impurity, silicon (Si), germanium (Ge), selenium (Se), tellurium (Te), carbon (C) or the like may be used. As the p-type impurity, magnesium (Mg), zinc (Zn), beryllium (Be) or the like may be mainly used.

In the present embodiment, as the first and second conductive semiconductor layers 141 and 143, a GaN layer may be used. That is, n-GaN may be used as the first conductive semiconductor layer 141, and p-GaN may be used as the second conductive semiconductor layer 143.

The light emitting structure 140 may be grown by using a metal organic chemical vapor deposition (MOCVD) method, a molecular beam epitaxy (MBE) method, a hydride vapor phase epitaxy (HVPE) method, or the like.

In addition, a buffer layer 150 maybe formed on a lower surface of the first conductive semiconductor layer 141, thereby reducing stress due to lattice mismatching between the growth substrate 110 and the first conductive semiconductor layer 141. As the buffer layer 150, an undoped-GaN or silicon carbide may be used.

The active layer 142 may be formed to have a multiple quantum well (MQW) structure in which a quantum well layer and a quantum barrier layer are alternately laminated, for example, a quantum well layer and a quantum barrier layer of $Al_xIn_yGa_{1-x-y}N$ ($0 \leq x \leq 1$, $0 \leq y \leq 1$, $0 \leq x+y \leq 1$) are alternately laminated, thereby having a predetermined band gap and allowing for recombination of electrons and holes due to a quantum well as described above to thus emit light.

The active layer 142 may be a layer serving to emit visible light having a wavelength range of about 350 nm to 680 nm and may be grown by using the MOCVD method, the MBE method, the HVPE method, or the like, similar to that of the first and second conductive semiconductor layers 141 and 143.

A lattice constant difference between the first conductive semiconductor layer 141 and the active layer 142 may be reduced by further forming an n-superlattice layer on a lower portion of the active layer 142. In addition, by further forming an electron blocking layer (EBL) on an upper portion of the active layer 142, electrons may not be recombined with holes in the active layer 142 and may be prevented from being transferred to the second conductive semiconductor layer 143. Whereby, internal quantum efficiency may be relatively more enhanced.

Figure 5:
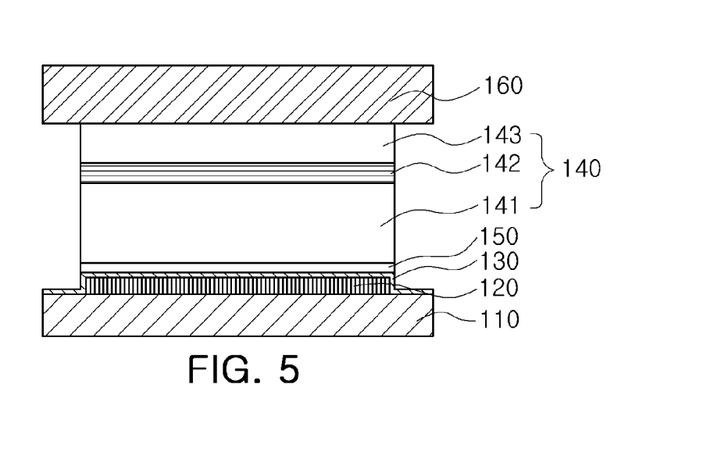

Then, as shown in FIG. 5, a support substrate 160 may be adhered to an upper surface of the light emitting structure 140. The support substrate 160 is a substrate to which the light emitting structure 140 is adhered. As the support substrate 160, various kinds of substrates may be used without being particularly limited.

Figure 6:
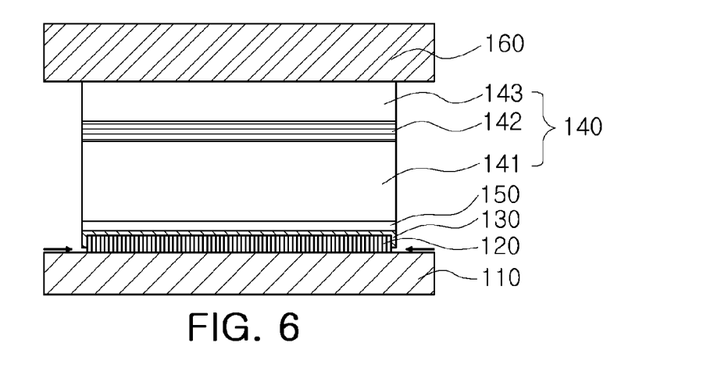

Subsequently, as shown in FIG. 6, the protective layer 130 may be etched such that the nanostructures of the sacrificial layer 120 are exposed. Here, in the protective layer 130, a portion that is in contact with the first region A1 of the growth substrate 110 may be etched so as to expose a side surface of the sacrificial layer 120 having the nanostructures. As an etching solution, HCl may be used.

Figure 7:
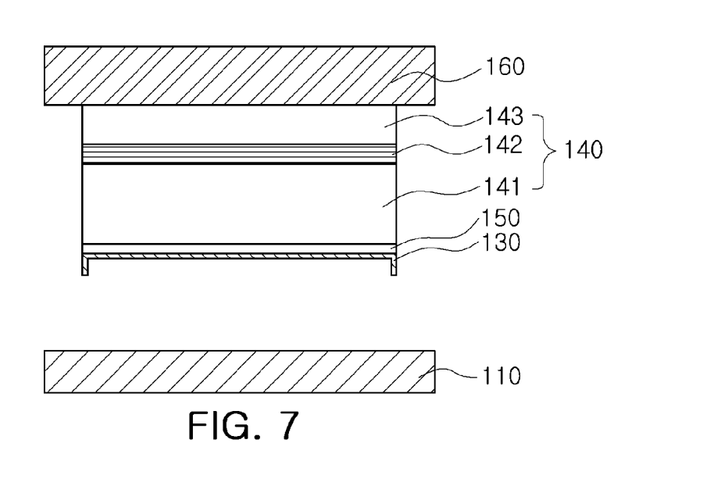

Thereafter, as shown in FIGS. 6 and 7, the light emitting structure 140 may be separated from the growth substrate 110 by injecting a wet etching solution through the exposed side surface of the sacrificial layer 120.

Here, since the etching solution may have etching selection properties to the sacrificial layer 120, only the sacrificial layer 120 may be selectively etched, for example, using HCl or HF.

As described above, since the sacrificial layer 120 has nanostructures, the infiltration of the wet etching solution between the nanostructures may be facilitated. Further, the nanostructures maybe on the nanometer scale in a fine structure, while a surface area contacting the wet etching solution may be relatively large, so an etching time may be reduced.

Accordingly, an exposure time to the etching solution may be reduced as compared to a case in which nanostructures are not formed in the sacrificial layer 120, and thus, a reduction in the quality of a semiconductor layer may be prevented.

Figure 8:
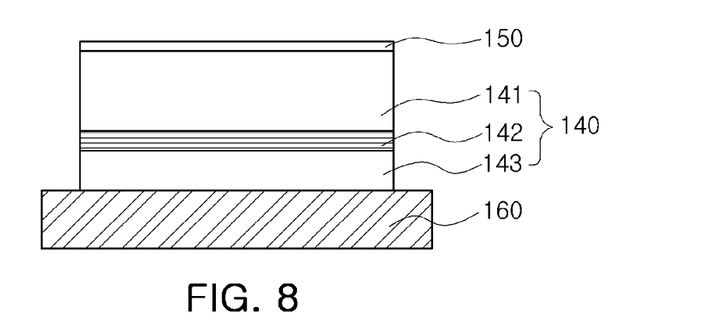

Then, as shown in FIG. 8, when the protective layer 130 that has not been etched is removed, only a structure in which the light emitting structure 140 is formed may remain on the support substrate 160.

The resultant structure may undergo a dicing process to be divided into a plurality of individuals through the separation thereof, and then, an n-type electrode 170 may be formed on one region of the first conductive semiconductor layer 141, thereby completing the semiconductor light emitting device 100.

The n-type electrode 170 may be formed of a single layer or a plurality of layers formed of a material selected from the group consisting of Ni, Au, Ag, Ti, Cr and Cu, and formed using a well-known deposition method such as chemical vapor deposition and electron beam evaporation, a sputtering process, or the like.

Figure 9:
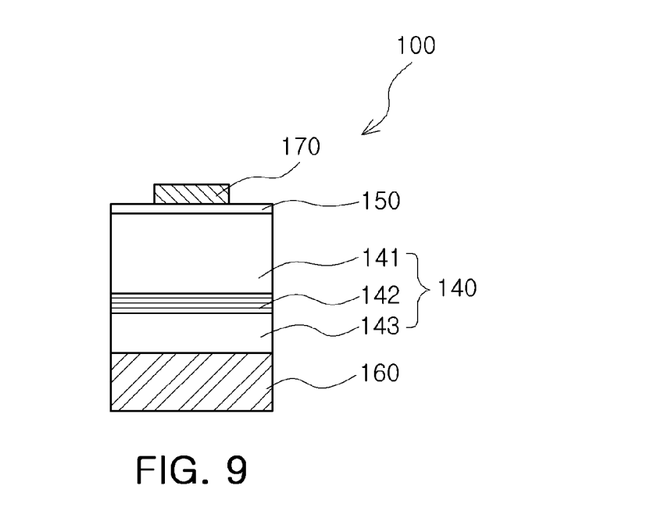

FIG. 9 is a cross-sectional view of a semiconductor light emitting device 100 manufactured by the manufacturing method as described above.

In the semiconductor light emitting device 100 manufactured by the manufacturing method as described above, since the growth substrate 110 may be separated by using a chemical wet etching process, thermal and physical impacts applied to the growth substrate 110 and the light emitting structure 140 may be significantly reduced, whereby a stabilized light emitting device may be manufactured. In addition, since damage to the growth substrate 110 may be prevented, the growth substrate 110 may be recycled through a relatively simple recycle/cleaning.

As set forth above, in a method of fabricating a semiconductor light emitting device according to an embodiment of the present invention, damage to and degradation of a light emitting structure at the time of separation of a growth substrate and a light emitting structure may be reduced.

While the present invention has been shown and described in connection with the embodiments thereof, it will be apparent to those skilled in the art that modifications and variations can be made without departing from the spirit and scope of the invention as defined by the appended claims.

What is claimed is:

1. A method of fabricating a semiconductor light emitting device, the method comprising:
   forming a sacrificial layer having a plurality of nanostructures on a growth substrate;
   forming a protective layer to cover an upper surface and side surfaces of the sacrificial layer, wherein the protective layer is not formed in spaces between adjacent nanostructures;
   forming a light emitting structure including a semiconductor layer of a first conductivity type, an active layer, and a semiconductor layer of a second conductivity type that are sequentially grown on the protective layer;
   etching the protective layer to expose the nanostructures in at least one side surface of the sacrificial layer; and
   separating the light emitting structure from the growth substrate by etching the exposed nanostructures.

2. The method of claim 1, wherein the growth substrate has an upper surface divided into a first region on an edge of the growth substrate and a second region defined as a region of the upper surface excepting the first region, and the forming of the sacrificial layer is only performed to form a plurality of nanostructures on the second region of the growth substrate.

3. The method of claim 2, wherein the first region is positioned along the edge of the growth substrate so as to surround the second region.

4. The method of claim 2, wherein the protective layer is formed to be extended to the second region of the growth substrate.

5. The method of claim 3, wherein the first region is spaced apart from he edge of the growth substrate by 1mm or less.

6. The method of claim 1, wherein the nanostructures are formed of a zinc oxide (ZnO)-based compound.

7. The method of claim 6, wherein the nanostructures are formed by allowing a plurality of nanorods to be grown on the growth substrate.

8. The method of claim 7, wherein the plurality of nanorods are provided such that a height thereof and an interval therebetween have a ratio of 50:1 to 100:1.

9. The method of claim 1, wherein the protective layer is formed of a metal nitride-based compound.

10. The method of claim 9, wherein the protective layer is formed of an aluminum nitride (AlN) or Chromium nitride (CrN), or by alternately laminating the aluminum nitride and the Chromium nitride.

11. The method of claim 9, wherein the protective layer is formed by a sputtering method.

12. A method of fabricating a semiconductor light emitting device, the method comprising:
    forming a sacrificial layer having a plurality of nanostructures on a growth substrate;
    forming a protective layer to cover the sacrificial layer;
    forming a light emitting structure including a semiconductor layer of a first conductivity type, an active layer, and a semiconductor layer of a second conductivity type that are sequentially grown on the protective layer:
    etching the protective layer to expose the nanostructures: and
    separating the light emitting structure from the growth substrate by etching the exposed nanostructures,
    wherein the growth substrate has an upper surface divided into a first region on an edge of the growth substrate and a second region defined as a region of the upper surface excepting the first region, and the forming of the sacrificial layer is only performed to form a plurality of nanostructures on the second region of the growth substrate, and
    wherein the etching of the protective layer to expose the nanostructures is performed to etch the protective layer positioned on the first region so as to expose a side surface of the nanostructures.

13. The method of claim 1, wherein the separating of the growth substrate from the light emitting structure is performed by chemical wet etching.

14. The method of claim 13, wherein a solution used in the chemical wet etching is HCl or HF.

15. The method of claim 1, further comprising forming a buffer layer on the protective layer before the forming of the light emitting structure thereon.

16. The method of claim 15, wherein the buffer layer includes a gallium nitride (GaN) or silicon carbide (SiC).

17. The method of claim 1, further comprising providing a support substrate on the light emitting structure before the separating of the growth substrate therefrom.

18. The method of claim 17, further comprising forming an electrode on a lower surface of the semiconductor layer of the first conductivity type from which the growth substrate has been separated after the separating of the growth substrate from the light emitting structure.

19. The method of claim 1, wherein the growth substrate is formed of a sapphire substrate, a silicon substrate, a silicon carbide substrate or a spinel substrate.

20. The method of claim 13, wherein the plurality of nanostructures have spaces formed therebetween so as to allow infiltration of a chemical web etching solution therebetween.

* * * * *